(12) United States Patent
Beam

(10) Patent No.: US 8,596,079 B2
(45) Date of Patent: Dec. 3, 2013

(54) INTELLIGENT VENTING

(75) Inventor: Jeffrey S. Beam, Edwardsville, IL (US)

(73) Assignee: American Power Conversion Corporation, West Kingston, RI (US)

(*) Notice: Subject to any disclaimer, the term of this patent is extended or adjusted under 35 U.S.C. 154(b) by 765 days.

(21) Appl. No.: 11/049,272

(22) Filed: Feb. 2, 2005

(65) Prior Publication Data
US 2007/0125107 A1 Jun. 7, 2007

(51) Int. Cl.
*F25D 17/04* (2006.01)

(52) U.S. Cl.
USPC ............ 62/186; 62/259.2; 62/178; 236/1 B; 236/49.3; 454/184; 361/695; 700/276; 700/277; 700/278; 165/205; 165/208; 165/212

(58) Field of Classification Search
USPC .......... 62/259.2, 186, 178; 361/695; 454/184; 236/1 B, 49.3; 165/205, 208, 212; 700/276–278
See application file for complete search history.

(56) References Cited

U.S. PATENT DOCUMENTS

| | | | | |
|---|---|---|---|---|
| 6,574,104 B2 * | 6/2003 | Patel et al. | ..... | 361/695 |
| 6,694,759 B1 | 2/2004 | Bash et al. | ..... | 62/180 |
| 6,747,872 B1 | 6/2004 | Patel et al. | ..... | 361/695 |
| 7,086,459 B2 * | 8/2006 | Beitelmal et al. | ..... | 165/205 |
| 2003/0067745 A1 | 4/2003 | Patel et al. | ..... | 361/690 |
| 2005/0156050 A1 * | 7/2005 | Shah et al. | ..... | 236/1 B |

OTHER PUBLICATIONS

International Search Report for PCT/US2006/003860, mailed Jun. 6, 2006.

* cited by examiner

*Primary Examiner* — Frantz Jules
*Assistant Examiner* — Azim Abdur Rahim
(74) *Attorney, Agent, or Firm* — Hunter Clark PLLC

(57) ABSTRACT

A system for regulating gas flow for a computer room containing computer components includes vents configured to direct gas from a gas supply toward the computer components, sensors disposed and configured to provide information regarding at least a first property associated with the computer components, and a controller coupled to the sensors and the vents and configured to effect a change in gas flow through a second one of the vents in accordance with a first value of the first property associated with a first of the computer components.

28 Claims, 6 Drawing Sheets

INTELLIGENT VENTING

BACKGROUND

Computer-room air-conditioning (CRAC) systems are utilized in the computer industry to provide cooling and other forms of air "conditioning" to the computer room to cool heat-generating computer components (e.g., servers) in the computer room and to otherwise provide an environment suitable for and non-damaging to the computer components.

Cooling gas provided by the air-conditioning unit can be directed through passages under a raised floor of the computer room and then through floor-tile vents into the computer room (also referred to as a "data center room"). Each floor-tile vent is positioned proximate to one or more computer components such that cool gas is directed from each vent preferentially toward one or more computer components. The amount of air supplied through the vents to a particular component (e.g., a heat load) in the computer room is a function of three variables: (1) the available air pressure below the tile vent; (2) the air pressure above the tile vent; and (3) the aerodynamic properties of the vent, itself. The heat loads in the computer room, however, are often not homogeneous in terms of position and/or time.

SUMMARY

In general, in an aspect, the invention provides a system for regulating gas flow for a computer room containing computer components, the system including vents configured to direct gas from a gas supply toward the computer components, sensors disposed and configured to provide information regarding at least a first property associated with the computer components, and a controller coupled to the sensors and the vents and configured to effect a change in gas flow through a second one of the vents in accordance with a first value of the first property associated with a first of the computer components corresponding to a first one of the vents.

Implementations of the invention may include one or more of the following features. The controller is configured to effect changes in gas flow through both the second of the vents and the first one of the vents. The change effected in the gas flow through the first vent changes the first value toward a more desirable value and the change effected in the gas flow through the second vent associated with a second computer component changes a second value of a property associated with the second computer component toward a less desirable value. The change in gas flow through the second vent is effected because the second vent is associated with a lower-priority computer component than the first computer component associated with the first vent. The controller effects changes in gas flows through a second sub-set of the vents to effect the change in gas flow through the first vent. The second sub-set of vents are associated with lower-priority computer components than the first computer component associated with the first vent. The controller is configured to effect changes in gas flow through a first sub-set of the vents to effect values of at least one property associated with computer components associated with the first sub-set of vents to more desirable values, the first sub-set of vents being higher priority than the second sub-set of vents as the computer components associated with the first sub-set of vents are of higher priority than the computer components associated with the second sub-set of vents. The first sub-set of vents have at least two different priority levels, the first sub-set of vents being associated with computer components of the at least two different priority levels. The controller is configured to adjust an acceptable value of the second value as at least part of effecting the change in gas flow through the second vent. The controller is configured to use knowledge of the first value relative to at least one of a desired and an extreme acceptable value of the first property to effect the change in gas flow through the second vent. The system is configured such that the change in gas flow through the first one of the vents is effected automatically by effecting the change in the second one of the vents.

Implementations of the invention may also include one or more of the following features. The at least a first property includes at least one of temperature, humidity, pressure, and gas flow rate. The change is effected by altering an openness of louvers of the second one of the vents. The controller is configured to implement operational modes including at least one independent mode in which the gas flow through the second vent is changed without regard to a change in gas flow effected at the first vent associated with the first computer component, and/or at least one cooperative mode in which the gas flow through the second vent is changed in accordance with both the value of the first property and with a change in gas flow effected at the first vent. The first value is one of an extreme temperature associated with the computer components and an average temperature associated with the computer components. The controller includes controllers corresponding to and coupled to respective ones of the vents.

In general, in another aspect, the invention provides a method of regulating gas flow for a computer room containing computer components, the method including flowing gas in the computer room toward a first computer component, of the computer components, with a first flow profile including at least one first flow characteristic and toward a second computer component, of the computer components, with a second flow profile with at least one second flow characteristic, determining a first value of a first property associated with at least one of the computer components, and adjusting the second flow characteristic of the second flow profile of the flowing gas to alter a second value of a second property associated with the second computer component in accordance with the first value.

Implementations of the invention may include one or more of the following features. The method further includes adjusting the first flow characteristic of the first flow profile of the flowing gas in conjunction with adjusting the second flow characteristic in order to alter the first value of the first property. The adjusting includes reducing the gas flow rate toward the second computer component and increasing gas flow rate toward the first computer component. Reducing the gas flow rate toward the second computer component includes reducing openness of a vent directing gas toward the second computer component. Adjusting the second flow characteristic automatically causes the adjusting of the first flow characteristic. The first property is associated with the first computer component, the method further including: determining that the first value is at an undesirable value; and determining that adjusting the first value toward a desirable value is preferred over maintaining the second flow profile for the second computer component in a current state of the second flow profile; where the first flow characteristic is adjusted to change the first value toward the desirable value and the second flow characteristic is changed in an opposite manner from the adjusting of the first flow characteristic. Determining that adjusting the first value toward the desirable value of the first property associated with the first computer component is more preferred than maintaining the second flow profile for the second computer component in the current state of the second flow profile includes determining that the first computer component has a higher priority than the second computer component. Determining if the first computer component has a higher priority than the second computer component includes using knowledge of a predetermined priority associated with the first computer component. Using knowledge of a predetermined priority associated with the first computer component includes using knowledge that the first computer component provides a higher-priority function than a function provided by the second computer component. Determining that the first computer component has a higher priority than the second computer component includes analyzing where a second value of a second property associated with the second computer component is relative to an extreme acceptable value for the second value. The first value is a first temperature and the second value is a second temperature, and wherein determining that the first computer component has a higher priority than the second computer component includes determining that the second temperature is below the extreme acceptable value. The method further includes: determining that the second value is closer to a temperature target value for the second computer component than a third value of a third property associated with a third computer component is to a temperature target value for the third computer component; and deciding to adjust the second flow characteristic instead of a third flow characteristic of gas flow toward the third computer component based on determining the relative closeness of the second and third values relative to the second and third temperature target values, respectively. Determining that the first value is at an undesirable value includes comparing the first value to a threshold. Comparing the first value to a threshold includes comparing the first value to a range of acceptable values.

Implementations of the invention may also include one or more of the following features. The method further includes altering a preferred value of the second property associated with the second computer component. The method further includes limiting adjustment of the preferred value to an extreme value for the second property. The first value is one of an extreme temperature associated with the computer components and an average temperature associated with the computer components. The method further includes adjusting the at least a third flow characteristic of at least a third flow profile of the flowing gas to alter at least a third value of at least a third property associated with at least a third computer component in accordance with the first value. The second flow characteristic of the second flow profile of the flowing gas is adjusted to alter a second value of a second property associated with the second computer component in accordance with the first value and at least a second value of a second property associated with a second computer component of the computer components.

In general, in another aspect, the invention provides an intelligent vent subsystem for use in a system of vent subsystems for regulating gas flow to computer components in a computer room containing the computer components, the intelligent vent system being associated with a first of the computer components and including a communication interface configured to receive information from another vent subsystem in the system of vent subsystems, a conduit providing a passage for gas flow through the vent, an adjustable damper connected to the conduit and configured to affect gas flow through the conduit, a driver connected to the damper and configured to cause the damper to move to affect the gas flow through the conduit, and a controller connected to the driver and the communication interface and configured to control the driver to cause the damper to move to affect the gas flow through the conduit in accordance with a signal received by the communication interface that is associated with a value of a first property associated with the another vent subsystem.

Implementations of the invention may include one or more of the following features. The signal received by the communication interface indicates the value of the first property associated with the another vent subsystem. The signal received by the communication interface indicates a desired value of a second property associated with the vent subsystem and the controller is configured to control the damper to affect the gas flow through the conduit to change a second value of the second property toward the desired value. The controller is configured to use information regarding at least one of a temperature, a humidity, a pressure differential, and a gas flow rate associated with the another vent subsystem to control the driver to affect the gas flow through the conduit. The controller is configured to use information regarding relative function priorities of the first computer component and a computer component associated with the another vent subsystem to control the driver to affect the gas flow through the conduit. The controller is further configured to transfer data regarding at least one property associated with the vent subsystem toward the another vent subsystem.

Various aspects of the invention may provide one or more of the following capabilities. Flow of cooling fluid to critical loads may be prioritized, e.g., when the aggregate heat load in a data center exceeds a CRAC system's cooling capacity. This condition can exist if the CRAC system's cooling capacity is reduced due to a fault or human error or if the heat loads in the data center are increased beyond the normal CRAC system's output capacity. Even if the CRAC system's cooling capacity exceeds the aggregate heat load, the flow of cooling fluid at a critical load may be insufficient to properly cool the load absent the "intelligent" vent system management described herein. Room cooling can be performed without a central controller, and exemplary apparatus can operate both in a stand-alone as well as in a "cooperative" mode. Multiple of control variables (e.g., time, temperature, humidity, pressure, and/or velocity) may be used to affect room cooling, thereby offering added flexibility and adaptability.

DETAILED DESCRIPTION

Embodiments of the invention can address non-ideal heat profiles, e.g., in computer rooms. For example, gas is directed through "intelligent" vent systems into a computer room. Sensors are used to measure one or more of the following properties: temperature of, in, and/or near the computer components, humidity in and/or near the components, gas velocity passing through the vent systems, and gas pressure on opposite sides of one or more vents (from which gas flow can be determined). Gas flow through the vent systems can be redistributed as a function of the measured parameter(s).

The measured property (e.g., temperature) can be transmitted from a sensor associated with a component in the computer room to an electronic controller associated with (e.g., incorporated into) each of the vent systems, wherein the controllers provide the vent systems with localized "intelligence." The controller compares the measurement from an associated sensor with the parameter setpoint and generates commands as appropriate that can be communicated to, e.g., a motor coupled with louvers in the vent system to change (e.g., expand or constrict) the flow path through a vent to redistribute gas flow entering the computer room through the vents, which may be connected to a common air-conditioning source.

The vent systems are preferably adaptable in terms of being able to respond to dynamic conditions in the computer room (via, e.g., controlled manipulation of louvers in the flow path). Further, communication can be established between the controller and the vents to more-efficiently distribute gas flow. The vent systems are herein referred to as "intelligent vent systems." The vent systems can cooperate, e.g., with one vent system restricting its flow to assist another vent system that has a more-critical need for increased flow. Further still, the physical structure of the vents can be designed to alter characteristics of gas flow into the room (e.g., whistling caused by the gas flowing through the vents can be reduced by softening edges of the vent damper construction).

Figure 1:
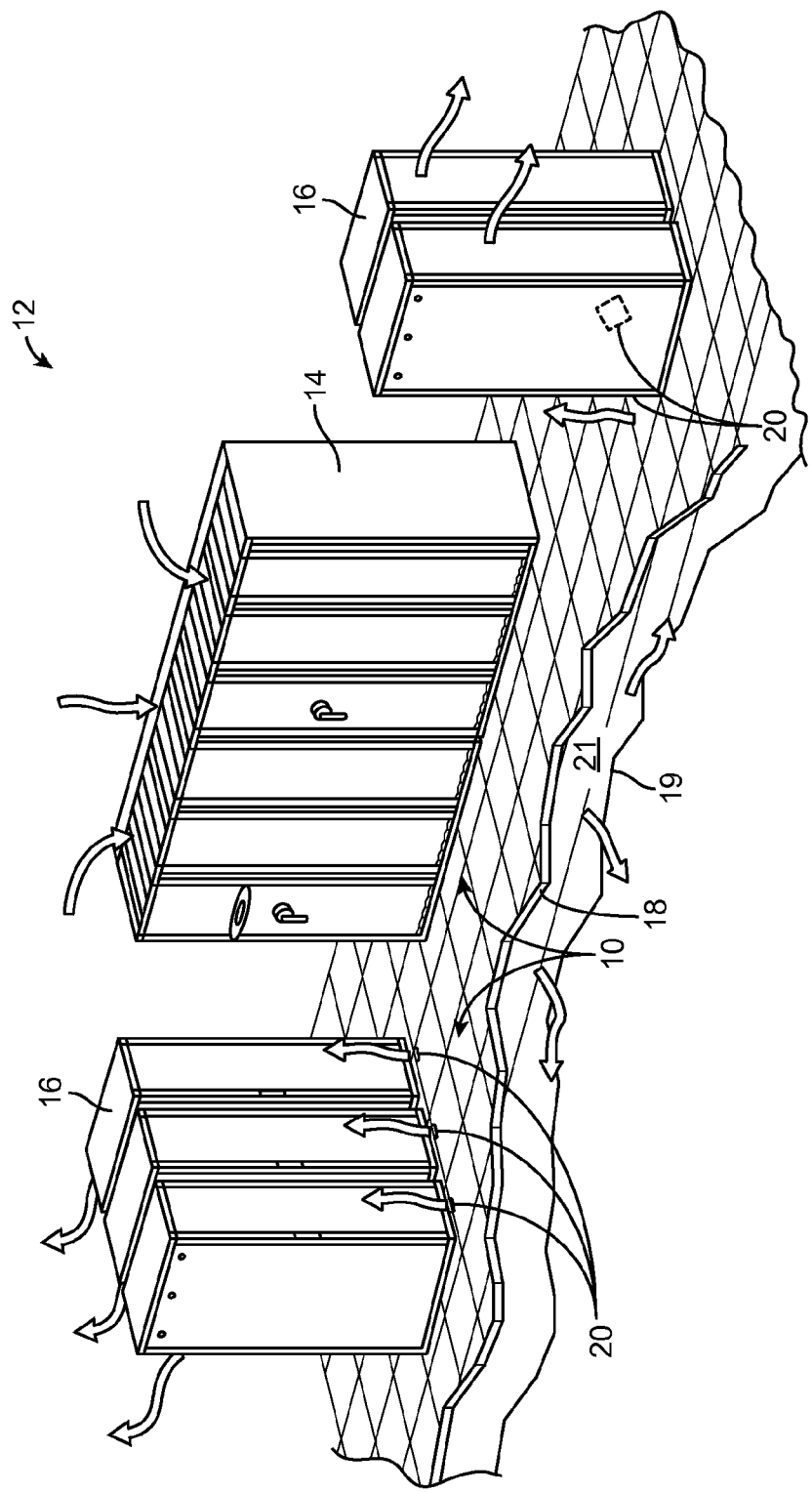
FIG. 1 is an illustration, partially schematic, of a computer room and air-conditioning system having an intelligent-floor-vent system design.

Referring to FIG. 1, a computer room 12 includes a computer-room air-conditioning (CRAC) system 14, racks 16 of computer components constituting heat loads, a raised floor 18, a sub-floor 19, and multiple vent systems 20. The room 12 is cooled by a cooling system 10 (that includes the air-conditioning system 14 and the vent systems 20) using a passage 21 between the raised floor 18 and the sub-floor 19. The vent systems 20 are each preferably governed by a respective controller including a microprocessor, microcontroller, application-specific integrated circuit (ASIC), or a similar programmable controlling device, as discussed further below. Each controller governs its respective vent to control the flow of cooling fluid (e.g., air) from the CRAC supply 14 through the vent system 20 to the heat load 16 (here, a server rack).

The vent systems 20 for the air-conditioning system can be disposed in the raised floor 18 of the computer room 12. Hot air, that has been heated by the components in the racks 16 in the computer room 12, is drawn in through the air conditioning unit 14, cooled, and passed through the space 21 between the raised floor 18 and the sub-floor 19. Air cooled by the air-conditioning unit 14 is passed through the floor vent systems 20 in the raised floor 18 and directed toward the heat loads.

Figure 2:
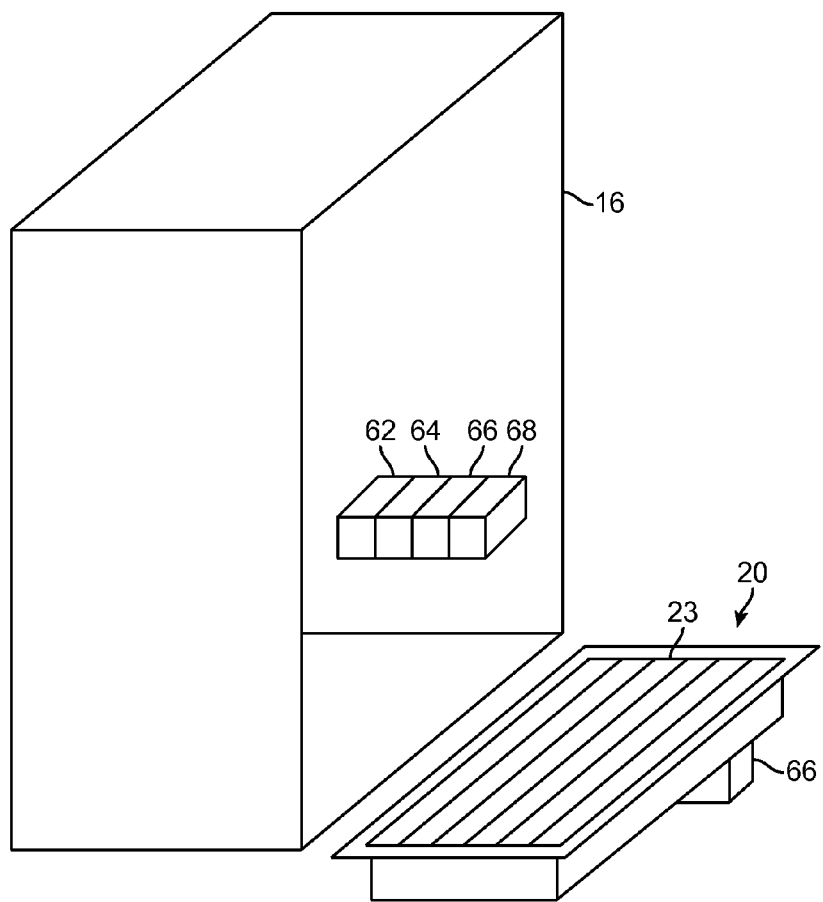
FIG. 2 is a simplified perspective view of a computer room rack, vent system, and sensors of the system shown in FIG. 1.

Referring to FIG. 2, the computer room 12 further includes sensors 62, 64, 66, 68, preferably corresponding to each of the vent systems 20, for measuring/monitoring and providing indications of various parameters, e.g., environmental parameters. The vent system 20 is shown disposed relative to the rack 16 as in FIG. 1, but with the floor 18 (FIG. 1) removed. Here, the sensors 62, 64, 66, 68 are a temperature sensor 62, a humidity sensor 64, a pressure sensor 66, and a cooling-fluid velocity sensor 68. The sensors 62, 64, 66, 68 are preferably disposed in close proximity to the corresponding vent systems 20, e.g., being disposed wholly or partially on or in the racks 16. While one temperature sensor 62 is shown, one or more temperature sensors 62 can be placed on or in each of the server racks 16 or wherever temperature control is desired. Similarly, one or more humidity sensors 64 can be placed at or in each of the server racks 16 or wherever humidity control is desired. Also, one or more of the differential pressure sensors 66 can be placed at each of the vent systems 20 for measuring the pressure differential across vents 23 of the vent systems 20 (i.e., the pressure difference between opposite sides of the vent 23, in the room 12 and in the ductwork leading to the room 12). Here, one pressure sensor 66 is disposed in the rack 16 and another pressure sensor 66 is disposed below and connected to the vent system 20. Also, one or more of the cooling-fluid velocity sensors 68 can be placed at each of the vents 23 for measuring the velocity of cooling fluid through the vents 23. Each of the sensors 62, 64, 66, 68 is connected to, and is in electronic communication with (e.g., via wires or via a wireless transmitter and receiver), vent controllers (discussed below) of the corresponding vent systems 20. The sensors 62, 64, 66, 68 measure and provide indicia to the vent controllers regarding the respective measured parameters for use by the controllers to regulate operation of the vent systems 20. As shown, the vent system 20 has a length of about a width of an opening in the front of the rack 16, e.g., about 17 inches.

Figure 3:
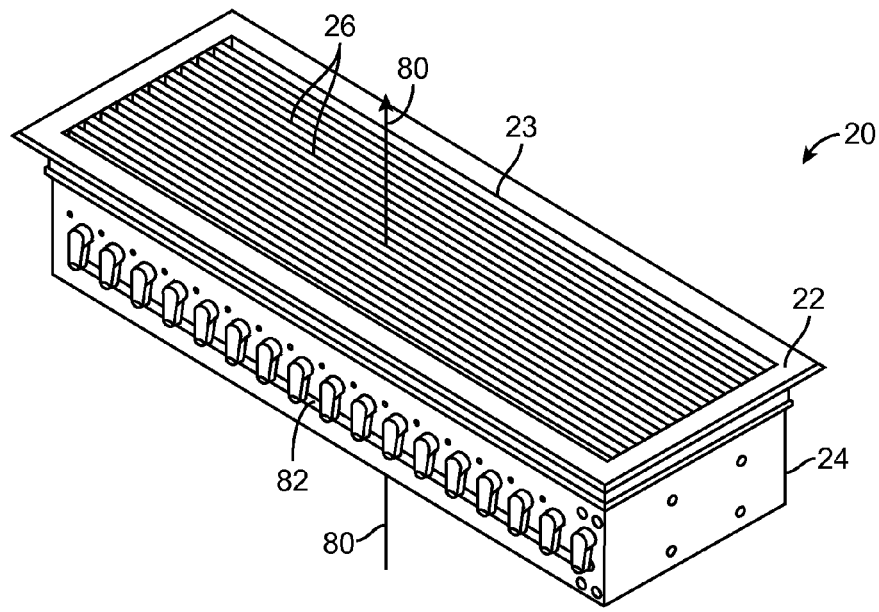
FIG. 3 is a perspective view of an intelligent vent system.
Figure 4:
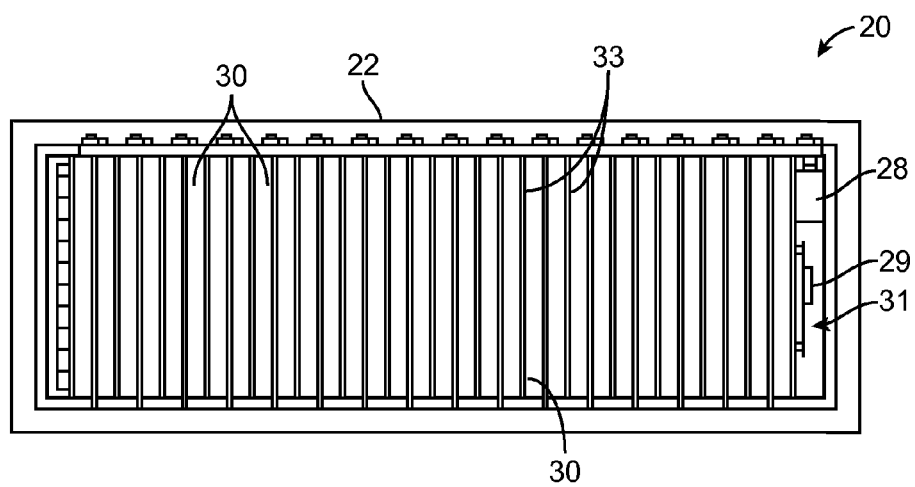
FIG. 4 is a bottom view of the intelligent vent system illustrated in FIG. 3.

Referring to FIGS. 3-4, an exemplary intelligent vent system 20 includes a flange 22 configured to rest on top of a floor panel, the vent 23, a louver tray 24, a stepper/servo motor 28, and a controller 29 on a printed circuit board 31. Each of the vent systems 20 is preferably configured similarly, although this is not required. The vent 23 includes fins 26 for directing gas through the vent 23 and the louver tray 24 includes louvers 30 for regulating how much gas can pass through the vent 23 (by opening and closing to various degrees to enlarge or constrict a total passage cross-sectional area of the louver tray 24). Referring also to FIG. 1, the vent 23 is disposed (embedded) in the flange 22 that will rest on a floor tile of the raised floor 18 of the computer room 12, with the floor tile having a hole larger than the louver tray 24 but smaller than the flange 22. The system 20 is configured to allow gas to pass between the louvers 30 and the fins 26 as indicated by an arrow 80 such that when in place in the raised floor 18, cool gas can pass from the region 21 through the vent system 20 into the room 12 above the floor 18, including into the racks 16.

The amount of gas flow is regulated by the controller 29 and the stepper motor 28. The controller 29 is configured to receive data from the sensors 62, 64, 66, 68 and determine if the gas flow is acceptable, should be increased, or should be decreased. The controller 29 can produce and send commands to the motor 28 to instruct the motor 28 to open or shut the louvers 30 if the gas flow is desired to be changed. The motor 28 is connected to the louvers 30 by a control linkage 82 and is configured to move (pivot or rotate) the louvers 30 between open and closed positions (the closed position of the louvers 30 being shown in FIG. 4). In the open and closed positions, the louvers 30 are at their least-transverse, and most-transverse, to the gas flow path (e.g., the arrow 80), respectively. In the closed position, the louvers 30 preferably touch, or nearly touch, separation walls 33 that guide gas through the vent system 20. In the closed position, the louvers 30 do not necessarily completely prevent flow of gas through the vent system 20. Movement of the louvers 30 expands or restricts a cross-sectional area of a passage through the system 20 between the walls 33 to increase or decrease gas flow through the vent system 20. The controller 29 includes a processor and memory storing computer program code instructions that can be read and executed by the processor to perform functions of the controller 29.

A communications interface (e.g., a controller area network (CAN), RS-485, or Ethernet (TCP/IP)) can be coupled with each of the vent systems 20 and/or sensors for communication. Information can be transferred from the interface indicating status of the vent system 20 and can be transferred to the vent system 20, e.g., to provide commands to control operation of the system 20. Depending on the control method, the communicated data may include some or all of the following: load priority (e.g., critical, high, medium or low); percent open (for the vents 23); measurements for control variables (e.g., present temperature); and, for the control variable(s), preferred setpoint(s), present setpoint(s), extremum/extrema, and deadband(s).

Additionally, a local user interface can be communicatively coupled with the controller 29 to enable configuration and alarming. For example, a liquid crystal display may be provided to indicate various information such as priority level, setpoint value, extremum value, etc. One or more light emitting diodes may be provided to indicate a problem or problems. An annunciator or other audible device may be provided to sound an alarm. One or more (e.g., two) dual in-line package (DIP) switches may be provided for entering information such as a priority level (e.g., high, low, medium) for the vent system 20. The user interface and/or communications interface may be integrated into the vent system 20 or may be separated from the vent system 20, e.g., in a 1U box located in the data room 12.

The controller(s) 29 may be configured to operate the vent system(s) 20 in one or more of a variety of modes. The systems 20 may be capable of operating in multiple modes, in which case a default mode is programmed, and different modes may be selected, e.g., by interfacing with the controller 29. Also, while the room 12 is shown with multiple intelligent vent systems 20, the air conditioning system for the room 12 can include a single intelligent vent system or multiple vent systems. Thus, the operation of the air conditioning system depends on the configuration of the system (e.g., how many intelligent vent systems 20 there are) and on the configuration of the intelligent vent system(s), in particular the mode in which the vent system(s) 20 operate. Exemplary modes in which the intelligent vent systems 20 may operate to control the flow of cooling fluid independently are provided below (and are designated as "I" modes for independent).

Mode I1: A time-dependent sequence of percent-open settings (e.g., 100% open, 50% open, 0% open) for the louvers 30 is entered into the controller 29, which sends commands to the stepper motor 28 to move the louvers 30 to achieve the percent-open settings as specified in the program. The percent-open amounts are indicative of the amount of gas flow rate relative to maximum flow rate for the vent 23. The percent-open settings can be based on a variety of factors, e.g., anticipated heat loads, where the 100%-open setting may be used when the heat load (e.g., a corresponding rack of servers) is operating at maximum heat load, with the controller 29 gradually closing the louvers 30 as the anticipated heat load in the heat load drops.

Mode I2: The temperatures of, in, and/or near components (e.g., near inlets and/or exhaust ports of components) in the computer room 12 are measured by the sensors 62, and either the maximum measured temperature or the average temperature for multiple temperature sensors 62 is compared by the controller 29 to a preprogrammed temperature setpoint or to a sequence of time-dependent setpoints.

Mode I3: The humidity in the gas in or surrounding the components is measured by the humidity sensors 64, and either the minimum humidity reading or the average humidity for multiple sensors is compared by the controller 29 to a preprogrammed humidity setpoint or to a sequence of time-dependent setpoints. In a computer room, temperature and humidity are both a function of the supplied air conditioning. Having a relative humidity in the range of 45-50% is normally desired. The humidity helps to control static discharge.

Mode I4: The pressure is measured via pressure gauges on opposite sides of the vent to determine the pressure differential across the vent. The measured pressure differential is compared by the controller to a preprogrammed pressure-differential setpoint or to a sequence of time-dependent setpoints.

Mode I5: The velocity of gas flow through one or more vents is measured via flowmeter. The measured velocity of the cooling gas is then compared to a preprogrammed setpoint or to a sequence of time-dependent setpoints.

After the controller 29 for each of the vent systems 20 compares the measured value(s) with the setpoint(s), the respective controller 29 generates and transmits commands to its associated vent system 20 to move the louvers 30, if appropriate, to further open or close the vent's gas-flow passage to regulate gas flow so that the property(ies) of interest more closely approaches the setpoint(s). The controller 29 will cause the stepper motor 28 to adjust the louvers 30 depending upon the comparison(s) of the measured and preset temperature(s), humidity(ies), pressure(s), and/or velocity(ies). For example, for a desired temperature setpoint, if the measured temperature (either maximum or average) exceeds the setpoint (or an acceptable range including the setpoint), then the controller 29 is inclined to cause the louvers 30 to be opened more, if possible. Conversely, if the measured temperature is below the setpoint (or the acceptable range), then the controller 29 is inclined to cause the louvers 30 to be closed more, if possible. If the measured temperature equals the setpoint (or is within the acceptable range), then the louvers 30 are preferably not moved. The acceptable temperature range may be set to help ensure adequate cooling of the components in the room 12 while encouraging using less cooling to conserve energy and reduce cost. For humidity, a measured humidity exceeding the setpoint (or range) will weigh in favor of closing the louvers 30 more and a measured humidity less than the setpoint (or range) will weigh in favor of opening the louvers 30 more. For pressure, a measured pressure exceeding the setpoint (or range) will weigh in favor of opening the louvers 30 more and a measured pressure less than the setpoint (or range) will weigh in favor of closing the louvers 30 more. For velocity, a measured velocity exceeding the setpoint (or range) will weigh in favor of closing the louvers 30 more and a measured velocity less than the setpoint (or range) will weigh in favor of opening the louvers 30 more. The amount that the controller 29 instructs the vent system 20 to open or close, if at all, is determined by a composite of the influences of the individual measurements used. Some measurements (e.g., temperature and humidity) may be weighted to have greater influence in the decision.

Exemplary modes in which a group of the intelligent vent systems 20 connected by a communications interface (e.g., CAN, Ethernet or RS-485) can cooperatively control the flow of cooling fluid through the vents 23 are provided below (and are designated as "C" modes for cooperative).

Mode C1:

Each intelligent vent system 20 is independently controlled based on a temperature setpoint, a humidity setpoint, a pressure setpoint, or a fluid-velocity setpoint. The initial setpoint is referred to as the "preferred setpoint" and may be unique to each vent system 20. If a vent system 20 fails to regulate properly (e.g., the measured temperature is too high, humidity is too low, pressure is too low, or fluid velocity is too low relative to the corresponding setpoint), the other vent systems 20 in regulation (with each desired parameter at an acceptable level) can restrict the fluid flow to their respective heat loads to compensate for the improperly regulating vent system 20. Restricting flow at one or more of the vent systems 20 helps the vent system 20 that is not regulating properly to get into regulation.

Redistribution of fluid flow may be achieved by any of a number of techniques, including adjusting (e.g., increasing for temperature) the setpoint associated with one or more of the vent systems 20 to a new value. For example, the setpoint associated with the vent system(s) 20 can be progressively adjusted by a preprogrammed or user-configurable amount (delta) until either a specified user-configurable extremum is reached, or until all vent systems 20 come into regulation. As with the preferred setpoint, the extremum may be unique to each of the vent systems 20. The monitoring-and-control sequence performed at each of the vent systems 20 has the effect of providing additional pressure, and thereby cooling fluid, to the vent systems 20 that are not in regulation. In this mode, the preferred setpoint can also be time-dependent.

In order to provide prioritization of vents for critical loads in this mode, the user configures the high-priority vent systems 20 with extrema (i.e., a maximum or minimum (depending upon the parameter) desired and/or allowed value for a parameter). The extrema of different vent systems 20 may be the same or different and the extrema of high-priority vent systems 20 are bounded by the extrema of the lower-priority vent systems 20. For example, where temperature is the control parameter, the temperature extremum is lower at the high-priority vent systems 20 than it is at the lower-priority vent systems 20. The high-priority extremum may even be set equal to the preferred setpoint. Thus, the low-priority vent systems 20 will continue to restrict flow of the cooling fluid to their heat loads even after the high-priority vent systems 20 have reached their extremum and have increased fluid flow to their respective heat loads. It is expected that in application, multiple lower-priority vent systems 20 will support multiple higher-priority vent systems 20. The higher-priority systems 20 may outnumber the lower-priority systems 20. Also, the higher-priority systems may not have the same priority (e.g., different systems 20 may have different extrema, e.g., 74, 75, 76° F., respectively).

Figure 5:
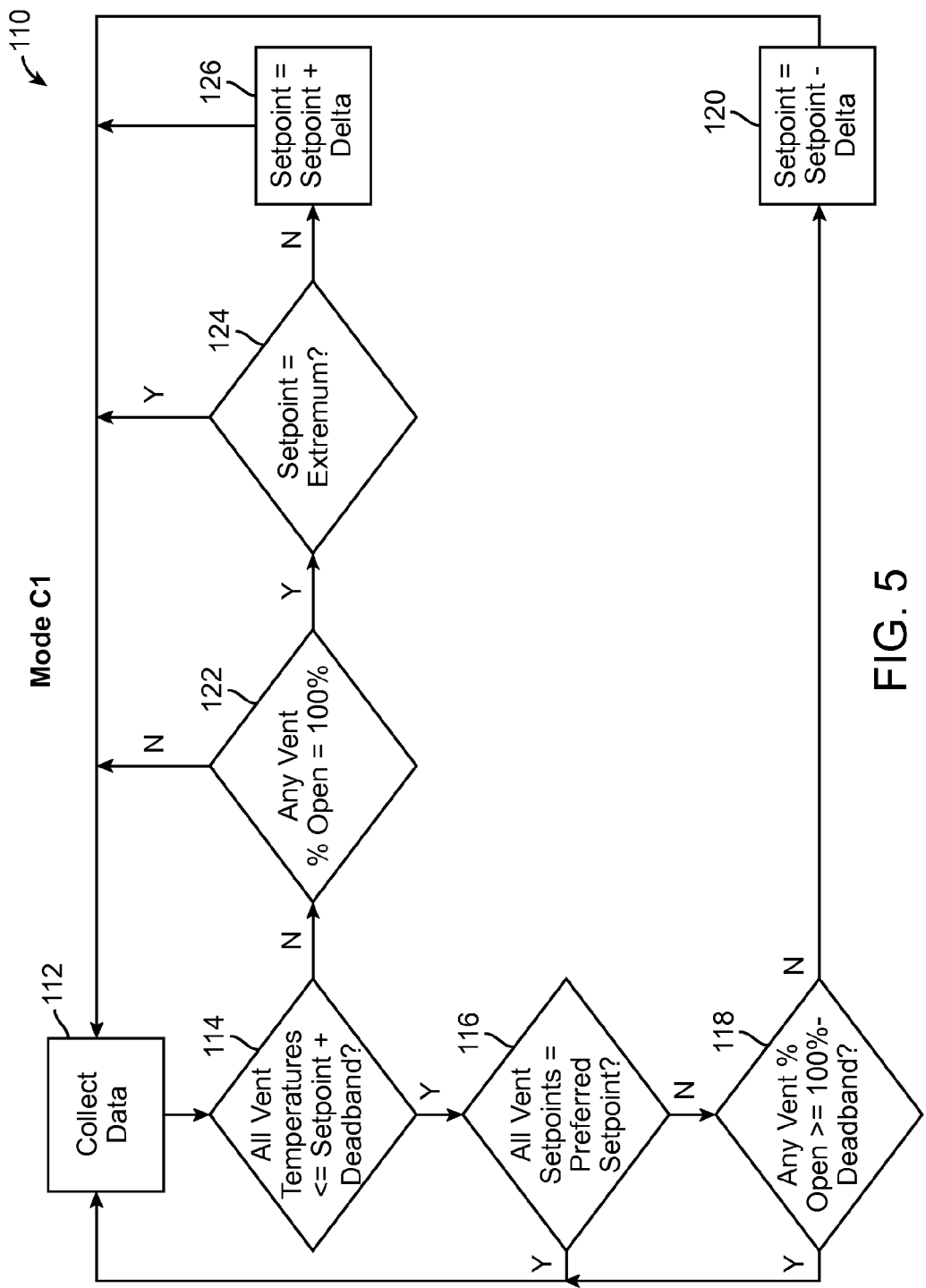
FIG. 5 is a flow chart for a vent system control mode based on temperature.

In operation, referring to FIG. 5, with further reference to FIGS. 1-4, a process 110 for cooling the room 12 in mode C1 using the cooling system 10 includes the stages shown. The process 110, however, is exemplary only and not limiting. The process 110 may be altered, e.g., by having stages added, removed, or rearranged. In the process 110, temperature is used as the controlling parameter.

At stage 112, data are collected for use in regulating the cooling provided by the system 10. Here, temperature data are collected at temporal increments based on how quickly the cooling system 10 can respond and equilibrate in response to changes (e.g., every 30 seconds or every minute, etc.). The data in this case are temperature data collected from the temperature sensors 62 associated with each of the vent systems 20 (including the temperature of the component(s) preferentially cooled by the particular vent systems 20).

At stage 114, the collected data are compared against corresponding setpoints. The temperature data for each of the vent systems 20 are compared with the setpoint established for that vent system 20. If the temperatures associated with the vent systems 20 (as communicated to all of the vent systems 20, preferably as a temperature relative to the setpoint) are less than or equal to the respective setpoints plus deadband values, then the process 110 proceeds to stage 116. The deadband value may be different for different vent systems 20 and is provided to help prevent excessive fluctuation in this decision tree if the temperature for a vent system 20 is hovering around its corresponding setpoint. The deadband value for temperature may be, e.g., 2° F. If any of the temperatures exceeds the corresponding sum or setpoint and deadband value, then the process 110 proceeds to stage 122.

At stage 116, the controller 29 evaluates whether other vent system setpoints, as communicated by the controllers 29 of the other vent systems 20, are at the initial "preferred" setpoint values. If so (i.e., all vent setpoints=preferred setpoints), then the monitoring-and-control process 110 returns to stage 112 for further data collection. If not (i.e., at least one vent setpoint≠its preferred setpoint), then the process 110 proceeds to stage 118.

At stage 118, an evaluation is made as to whether any vent 23 is substantially open. The controller 29 determines whether any vent 23 is within a deadband value (e.g., 5%) of its maximum opening, which would thereby indicate that cooling is "maxed out" at that vent 23. If so (i.e., a vent 23 is near fully open), then the monitoring-and-control returns to stage 112 for further data collection. If not (i.e., no vents 23 are near fully open) then the setpoint of a vent system 20 whose setpoint is inequal to its preferred setpoint is adjusted (for temperature setpoints, the setpoint is reduced) by a value, delta, at stage 120 and the process returns to stage 112. The value, delta, can be preprogrammed and/or user-configurable and can be of a variety of values, e.g., 1° F.

At stage 122, an evaluation is made as to whether any vent 23 is fully (100%) open. If no vent is fully open, then the process 110 returns to stage 112 for further data collection. If at least one vent 23 is fully open, then the process 110 proceeds to stage 124.

At stage 124, the setpoint for the controlled vent system 20 is compared with the extremum in step 40. If the setpoint is equal to the extremum, then the process 110 returns to stage 112 for further data collection. If the setpoint for the controlled vent system 20 is not equal to the extremum and thus less (for temperature) than the extremum, then the setpoint for the controlled vent system 20 is raised (for temperature) by a value, delta (e.g., 1° F.), at stage 126 and the process 110 returns to stage 112 for further data collection. Accordingly, as the sequence is performed by each vent controller 29, each setpoint that is not at its extremum can be raised (assuming temperature is being evaluated). The extremum can be, e.g., the temperature at which the component(s) corresponding to the vent system 20 may be damaged by excessive heat.

Where a vent system 20 is out of compliance (e.g., where the temperature of the associated component is above the setpoint), that vent system 20 and component can be brought into compliance as a consequence of each of the other controllers 29 restricting the flow of cooling gas through its associated vent 23 by incrementally closing the vent system's louvers 30.

The following data illustrate an example of three vent systems (VS) 20 with their controllers 29 operating in Mode C1. The samples below represent time-sequential iterations achieved in accordance with the process 110. The temperature measurements in the following charts are assumed to be in degrees Fahrenheit.

In this example, it is assumed (for the purposes of illustration) that the heat loads for vent systems 1 and 2 are identical and that the heat load for vent system 3 is somewhat larger. Vent system 2 is prioritized by making its extremum lower than the extrema of vent systems 1 and 3 because mission-critical equipment is in the rack associated with vent system 2.

|  | VS 1 | VS 2 | VS 3 |
|---|---|---|---|
| Sample 1: | | | |
| Extremum | 80 | 74 | 80 |
| Preferred Setpoint | 72 | 72 | 72 |
| Deadband | +/−1 | +/−1 | +/−1 |
| Actual Setpoint | 72 | 72 | 72 |
| Measured Temperature | 72 | 72 | 72 |
| % Open | 60 | 60 | 80 |
| Sample 2: | | | |
| Extremum | 80 | 74 | 80 |
| Preferred Setpoint | 72 | 72 | 72 |
| Deadband | +/−1 | +/−1 | +/−1 |
| Actual Setpoint | 72 | 72 | 72 |
| Measured Temperature | 74 | 74 | 74 |
| % Open | 75 | 75 | 95 |
| Sample 3: | | | |
| Extremum | 80 | 74 | 80 |
| Preferred Setpoint | 72 | 72 | 72 |
| Deadband | +/−1 | +/−1 | +/−1 |
| Actual Setpoint | 72 | 72 | 72 |
| Measured Temperature | 76 | 76 | 76 |
| % Open | 85 | 85 | 100 |
| Sample 4: | | | |
| Extremum | 80 | 74 | 80 |
| Preferred Setpoint | 72 | 72 | 72 |
| Deadband | +/−1 | +/−1 | +/−1 |
| Actual Setpoint | 73 | 73 | 73 |
| Measured Temperature | 77 | 77 | 77 |
| % Open | 95 | 95 | 100 |
| Sample 5: | | | |
| Extremum | 80 | 74 | 80 |
| Preferred Setpoint | 72 | 72 | 72 |
| Deadband | +/−1 | +/−1 | +/−1 |
| Actual Setpoint | 74 | 74 | 74 |
| Measured Temperature | 78 | 78 | 78 |
| % Open | 100 | 100 | 100 |
| Sample 6: | | | |
| Extremum | 80 | 74 | 80 |
| Preferred Setpoint | 72 | 72 | 72 |
| Deadband | +/−1 | +/−1 | +/−1 |
| Actual Setpoint | 75 | 74 | 75 |
| Measured Temperature | 78 | 78 | 78 |
| % Open | 100 | 100 | 100 |
| Sample 7: | | | |
| Extremum | 80 | 74 | 80 |
| Preferred Setpoint | 72 | 72 | 72 |
| Deadband | +/−1 | +/−1 | +/−1 |
| Actual Setpoint | 76 | 74 | 76 |
| Measured Temperature | 78 | 78 | 78 |
| % Open | 100 | 100 | 100 |
| Sample 8: | | | |
| Extremum | 80 | 74 | 80 |
| Preferred Setpoint | 72 | 72 | 72 |
| Deadband | +/−1 | +/−1 | +/−1 |
| Actual Setpoint | 77 | 74 | 77 |
| Measured Temperature | 78 | 78 | 78 |
| % Open | 100 | 100 | 100 |
| Sample 9: | | | |
| Extremum | 80 | 74 | 80 |
| Preferred Setpoint | 72 | 72 | 72 |
| Deadband | +/−1 | +/−1 | +/−1 |
| Actual Setpoint | 78 | 74 | 78 |
| Measured Temperature | 78 | 76 | 78 |
| % Open | 85 | 100 | 95 |
| Sample 10: | | | |
| Extremum | 80 | 74 | 80 |
| Preferred Setpoint | 72 | 72 | 72 |
| Deadband | +/−1 | +/−1 | +/−1 |
| Actual Setpoint | 79 | 74 | 79 |
| Measured Temperature | 78 | 75 | 78 |
| % Open | 75 | 95 | 90 |

At time sample 1 (at the earliest time increment), the cooling system 10 is in a steady-state condition, the air conditioner and heat loads having been on for sufficient time to allow for all damper changes to settle out. At this time, all the vent systems 20 are able to regulate their temperatures at the preferred setpoints. Vent system 3 is open further than vent systems 1 and 2, since its heat load is larger.

In this example, something changes that keeps all the vent systems 20 from being able to regulate at their preferred setpoints. This condition can be caused by increased loads, loss of containment of the environment (e.g., a outside door is left open), CRAC(s) losing capacity to cool, etc.

At time sample 2, the measured temperature of each vent system 20 has increased, and the vent systems 20 are opening the vents 23 more to try to compensate for the increase in temperature. The actual setpoints are not being modified yet, since no vent 23 is 100% open (i.e., is at its maximum capacity for cooling) and thus the process 110 of mode C1 goes from stage 114, to stage 122, and returns to stage 112.

At time sample 3, the temperature has increased a little more, and the vent 23 of vent system 3 is now fully open, trying to cool to the actual measured temperature. The vent systems 20 will work together in accordance with the cooperative mode (C1) to help vent system 2 come into regulation. Here, a vent temperature exceeds the setpoint plus deadband value (stage 114), vent 3 is 100% open (stage 122), the setpoint is not at the extremum (stage 124), and thus the setpoints will be incremented by the delta value (stage 126).

At time sample 4, each vent system 20 has increased its actual setpoint by a delta, in order to try to bring all the vent systems 20 back into regulation. In this example, the delta is fixed at 1 degree, although other delta values may be used. For example, the delta can be calculated based on a classical control technique, called a PID (Proportional, Integral, Derivative). As of time sample 4, the measured temperature is still increasing and the process 110 will increment the setpoints at stage 126.

At time sample 5, each of the vent systems 20 has again increased its actual setpoint by the delta. Vent system 2 has reached its extremum and will not continue to alter its actual setpoint although the others will be incremented as the process 110 will again pass through stage 126.

At time samples 6-8, the two lower-priority vent systems 20, namely VS 1 and VS 3, continue to increase their actual setpoints while any of the vent systems 20 is at 100% open and unable to regulate. Thus, the setpoints of vent systems 1 and 3 increase to 77 each. The setpoints of vent systems 1 and 3 will further increase at stage 126 as not all vent temperatures are less than or equal to the setpoint plus deadband (stage 114), the vents 23 are open 100% (stage 122), and the setpoint for vent system 2 is at its extremum (stage 124).

At time sample 9, vent systems 1 and 3 come into regulation at their increased actual setpoints. This causes the vent systems to begin to close their vents 23, which provides additional cooling to vent 2. The setpoints of vent systems 1 and 3 will be incremented again at stage 126.

At time sample 10, vent systems 1 and 3 have again increased their actual setpoints, since vent system 2 was still at 100% in the last sample. Now all the vent systems 20 are in regulation (within their deadband). Vent system 2 is able to consume more cooling fluid and maintain its associated heat load at a lower temperature than the other lower-priority vent systems 20. No setpoint adjustments are made in response to the data at time sample 10 as all vent temperatures are less than or equal to the setpoint plus temperature deadband ("yes" at stage 114), all vent setpoints are not equal to their preferred setpoints ("no" at stage 116), and the vent 23 of vent system 2 is greater than or equal to 100% open minus openness deadband ("yes" at stage 118).

Figure 6:
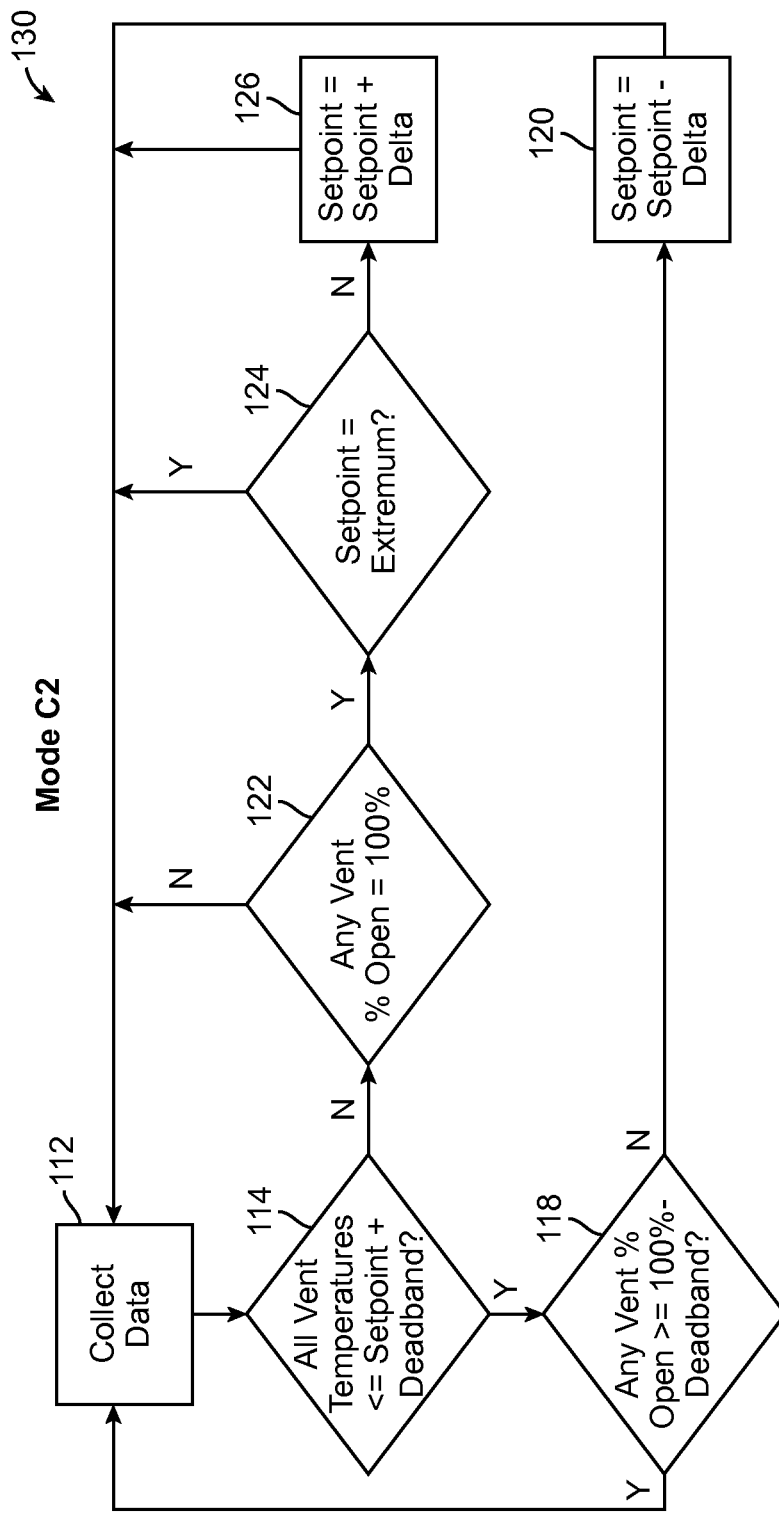
FIG. 6 is a flow chart for another vent system control mode based on temperature.

Mode C2:

In operation, referring to FIG. 6, with further reference to FIGS. 1-4, a process 130 for cooling the room 12 in mode C2 using the cooling system 10 includes the stages shown. The process 130, however, is exemplary only and not limiting. The process 130 may be altered, e.g., by having stages added, removed, or rearranged. In the process 130, temperature is used as the controlling parameter. Mode C2 is similar to mode C1, above, with at least two exceptions. The first exception is that the setpoint of each of the vent systems 20 in the cooling system 10 is not independent; in mode C2, the setpoint is common to every vent system 20 in the cooling system 10. The second exception is that the actual setpoint can be lower than the preferred setpoint. This mode causes all heat loads to run at the lowest (or highest) possible common setpoint (depending upon whether the setpoint is for temperature, humidity for controlling humidity, humidity for controlling temperature, pressure, or fluid velocity). In the case of temperature control, all heat loads will run at the lowest possible temperature that the CRAC can support and still maintain the same temperature for all heat loads. This also means that at least one vent 23 will be open 100%. Prioritization of critical heat loads is identical to the prioritization in mode C1.

The following time-sequential data illustrate an example of three vent systems (VS) 20 with their controllers 29 operating in Mode C2.

In this example, it is assumed that the heat loads for vent systems 1 and 2 are identical, and that the heat load for vent system 3 is somewhat larger. Vent system 2 is prioritized by making its extremum lower than the extrema of vent systems 1 and 3 because the customer has mission-critical equipment in the rack associated with vent 2. The preferred setpoint can be ignored, as it does not have significant meaning in this mode.

|  | VS 1 | VS 2 | VS 3 |
|---|---|---|---|
| Sample 1: | | | |
| Extremum | 80 | 74 | 80 |
| Preferred Setpoint | N/A | N/A | N/A |
| Deadband | +/−1 | +/−1 | +/−1 |
| Actual Setpoint | 72 | 72 | 72 |
| Measured Temperature | 65 | 65 | 69 |
| % Open | 100 | 100 | 100 |
| Sample 2: | | | |
| Extremum | 80 | 74 | 80 |
| Preferred Setpoint | N/A | N/A | N/A |
| Deadband | +/−1 | +/−1 | +/−1 |
| Actual Setpoint | 71 | 71 | 71 |
| Measured Temperature | 71 | 71 | 71 |
| % Open | 60 | 60 | 80 |
| Sample 3: | | | |
| Extremum | 80 | 74 | 80 |
| Preferred Setpoint | N/A | N/A | N/A |
| Deadband | +/−1 | +/−1 | +/−1 |
| Actual Setpoint | 70 | 70 | 70 |
| Measured Temperature | 70 | 70 | 70 |
| % Open | 65 | 65 | 85 |
| Sample 4: | | | |
| Extremum | 80 | 74 | 80 |
| Preferred Setpoint | N/A | N/A | N/A |
| Deadband | +/−1 | +/−1 | +/−1 |
| Actual Setpoint | 69 | 69 | 69 |
| Measured Temperature | 69 | 69 | 69 |
| % Open | 70 | 70 | 90 |
| Sample 5: | | | |
| Extremum | 80 | 74 | 80 |
| Preferred Setpoint | N/A | N/A | N/A |
| Deadband | +/−1 | +/−1 | +/−1 |
| Actual Setpoint | 68 | 68 | 68 |
| Measured Temperature | 68 | 68 | 68 |
| % Open | 75 | 75 | 95 |
| Sample 6: | | | |
| Extremum | 80 | 74 | 80 |
| Preferred Setpoint | N/A | N/A | N/A |
| Deadband | +/−1 | +/−1 | +/−1 |
| Actual Setpoint | 67 | 67 | 67 |
| Measured Temperature | 67 | 67 | 67 |
| % Open | 80 | 80 | 100 |

At time sample 1, the intelligent vent systems 20 have just been turned on. The vent systems 20 default to a nominal value for an actual setpoint, e.g., 72 degrees. For purpose of illustration, the vents 23 initialize to 100% open. Also, it is assumed that the air conditioner and the heat loads have been on long enough for everything to stabilize. In this example, the CRAC is cooling each load to a temperature lower than the actual setpoint.

At time sample 2, the effects of mode C2 begin to appear. The actual setpoint is common for all vent systems 20 in the cooling system 10, and this setpoint has been lowered compared to time sample 1. In this mode, one of the vent systems 20 is selected as the "master" for setting the actual, commonly shared setpoint, which is communicated to the controllers 29 of the other vent systems 20. The role of "master" can be dynamically moved to any of the vent systems 20 in the cooling system 10. At time sample 2, the vents 23 have closed to some extent (reduced from 100% open to 60% open) to regulate the temperature at the actual setpoint. The temperatures have been determined to be less than or equal to the setpoint plus the deadband (stage 114), no vent 23 determined to be open at least 100% minus the deadband (stage 118), and the setpoint reduced by delta (stage 120).

At time sample 3, the actual setpoint has been lowered again (according to stages 114, 118, 120), since no vents 23 are at 100% capacity. There is a corresponding drop in actual measured temperature.

At time samples 4 through 6, the master controller 29 continues to lower the actual setpoint until at least one of the vents 23 reaches 100% open (minus the %-open deadband, which is not illustrated). The actual setpoint is reduced in accordance with stages 114, 118, 120 until the vent 23 of vent system 3 reaches 100% open, and thus the process 130 of mode C2 returns from stage 118 to stage 112 and does not reduce the setpoint at stage 120 because stage 120 is avoided.

This is the steady-state point for the cooling system 10 (at least until something in the environment changes). The vent systems 20 have kept all heat loads at the same temperature, thus giving no load preferential treatment with regards to temperature. This temperature is the lowest possible temperature (given the constraints of the system, e.g., full degree temperature increments) that the cooling system 10 can maintain while allowing all loads to operate at the same temperature (i.e., all loads experience the same environment, at least with respect to temperature).

The actual setpoint could have risen above the initial 72 degree setpoint of time sample 1 if vent system 3 was not able to regulate at that temperature. The final steady-state setpoint could have been 73° or 74° for all vent systems 20. Once 74° was reached, however, the setpoint of vent 2 would stop increasing since this is its extremum. Vent systems 1 and 3 would continue to cooperate in increasing their respective setpoints until vent system 3 was able to regulate at the actual setpoint for those two vent systems 20.

Figure 7:
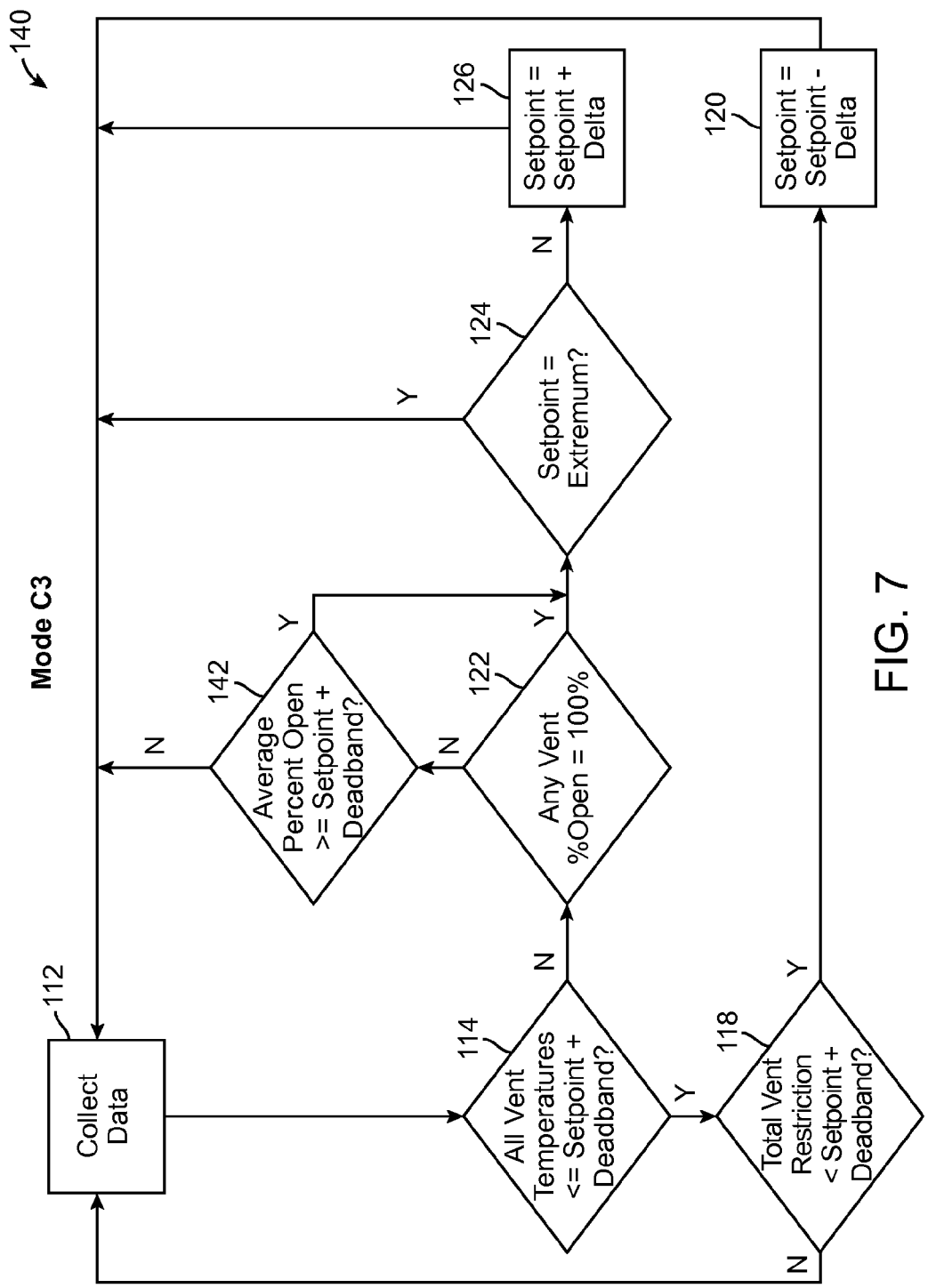
FIG. 7 is a flow chart for a vent system control mode based on temperature and on an openness of a vent.

Mode C3:

In operation, referring to FIG. 7, with further reference to FIGS. 1-4, a process 140 for cooling the room 12 in mode C3 using the cooling system 10 includes the stages shown. The process 140, however, is exemplary only and not limiting. The process 140 may be altered, e.g., by having stages added, removed, or rearranged. In the process 140, temperature is used as the controlling parameter. Mode C3 adds another condition to the operation of mode C2. Not only do the vent systems 20 operate cooperatively to control temperature or humidity, but they also operate cooperatively to keep other parameters of all the vent systems 20 at a preprogrammed value (e.g., total vent restriction to fluid flow). In this example, the other parameters are average % that a vent 23 is open, pressure, and fluid velocity. This cooperative operation helps keeps the average static pressure below the floor constant. If the average % open or fluid velocity is set large enough (or if pressure is set low enough), all loads will be kept at or below their temperature or humidity setpoints. In the situation where the average % open or fluid velocity is not set large enough (or where pressure is not low enough) for all vent systems 20 to regulate on either temperature or humidity, the temperature or humidity dominates control over the cooling fluid flow. In this mode, the temperature or humidity setpoint and the % open, pressure, or fluid velocity value can also be time dependent.

Mode C3 is similar to mode C2, except that mode C3 includes an additional stage, stage 142. If at stage 122 a determination is made that no vent 23 is fully open, then a determination is made at stage 142 as to whether average percent open of the vents 23 is greater than or equal to the sum of the setpoint and a vent-restriction deadband. This is a determination as to whether the total or average percent openness of the vents 23 is such that the pressure is maintained at or above a desired level. If the answer at stage 142 is "no," then the process 140 returns to stage 112 for further data collection. If the answer at stage 142 is "yes," then the process 140 proceeds to stage 124 for evaluation as to whether the setpoint equals the extremum.

The following time-sequential data illustrate an example of three vent systems (VS) 20 with their controllers 29 operating in Mode C2. In this example, vent system 2 is prioritized by making its extremum lower than the extrema of vent systems 1 and 3.

|  | VS 1 | VS 2 | VS 3 |
|---|---|---|---|
| Sample 1: | | | |
| Extremum | 80 | 74 | 80 |
| Preferred Setpoint | N/A | N/A | N/A |
| Deadband | +/−1 | +/−1 | +/−1 |
| Actual Setpoint | 72 | 72 | 72 |
| Measured Temperature | 65 | 65 | 69 |
| % Open | 100 | 100 | 100 |
| Average % Open | 100 | | |
| Sample 2: | | | |
| Extremum | 80 | 74 | 80 |
| Preferred Setpoint | N/A | N/A | N/A |
| Deadband | +/−1 | +/−1 | +/−1 |
| Actual Setpoint | 71 | 71 | 71 |
| Measured Temperature | 71 | 71 | 71 |
| % Open | 60 | 60 | 80 |
| Average % Open | 66.7 | | |
| Sample 3: | | | |
| Extremum | 80 | 74 | 80 |
| Preferred Setpoint | N/A | N/A | N/A |
| Deadband | +/−1 | +/−1 | +/−1 |
| Actual Setpoint | 70 | 70 | 70 |
| Measured Temperature | 70 | 70 | 70 |
| % Open | 65 | 65 | 85 |
| Average % Open | 71.7 | | |
| Sample 4: | | | |
| Extremum | 80 | 74 | 80 |
| Preferred Setpoint | N/A | N/A | N/A |
| Deadband | +/−1 | +/−1 | +/−1 |
| Actual Setpoint | 69 | 69 | 69 |
| Measured Temperature | 69 | 69 | 69 |
| % Open | 70 | 70 | 90 |
| Average % Open | 76.7 | | |
| Sample 5: | | | |
| Extremum | 80 | 74 | 80 |
| Preferred Setpoint | N/A | N/A | N/A |
| Deadband | +/−1 | +/−1 | +/−1 |
| Actual Setpoint | 68 | 68 | 68 |
| Measured Temperature | 68 | 68 | 68 |
| % Open | 75 | 75 | 95 |
| Average % Open | 81.7 | | |
| Sample 6: | | | |
| Extremum | 80 | 74 | 80 |
| Preferred Setpoint | N/A | N/A | N/A |
| Deadband | +/−1 | +/−1 | +/−1 |
| Actual Setpoint | 68 | 68 | 68 |
| Measured Temperature | 68 | 68 | 68 |
| % Open | 75 | 75 | 95 |
| Average % Open | 81.7 | | |

This mode-C3 example is similar to the example of mode C2, but here the average vent openness (here, the average % open) is used to stop the lowering/raising of the actual setpoint value. The average % open may be calculated, for example, by each vent system 20 broadcasting its percent openness and each vent system 20 computing the average over all the vent systems 20. If a vent openness limit is reached, then adjustments to the actual setpoint are halted to inhibit lowering of the pressure below a desired value.

For this example, it is assumed the user wants the average vent openness to be no greater than 80%. The time-sequential data progresses in this example much as in the mode C2 example. Here, at time sample 5, the average vent open percent is 81.7% and has thus exceeded the desired openness limit. Thus, the actual setpoint is not decreased again before time sample 6, since the average vent openness has already reached the target limit and thus the process 140 proceeds to stage 124. While the limit in mode C2 becomes the first vent to reach 100%, the limit in mode C3 is the total vent restriction to fluid flow. In this example, average vent restriction is used to illustrate this control mode.

As in mode C2, the setpoint could have risen above the initial 72-degree setpoint. In this case, the vent systems 20 would continue to increase the actual setpoint until the average vent restriction equals 80% or until the vent system(s) 20 reach its(their) extremum(a). Such a scenario could occur, for example, where temperature or humidity dominate the behavior, rather than the total vent restriction.

Other embodiments are within the scope of the invention. In describing embodiments of the invention, specific terminology is used for the sake of clarity. For purposes of description, each specific term includes technical and functional equivalents of such terms. Additionally, in some instances where a particular embodiment of the invention includes multiple elements or process stages, those elements or stages may be replaced with a single element or stage; likewise, a single element or stage may be replaced with multiple elements or stages. When determining which vent 23 to adjust, the relative closeness of a parameter to its corresponding preferred setpoint for multiple vent systems 20 may be considered, e.g., with the vent 23 whose corresponding parameter is closer to its preferred setpoint being selected to have its openness adjusted. Numerous damper configurations may be used. While the above description focused on pivotable louvers, other configurations of dampers for inhibiting/facilitating gas flow are acceptable. Further, while the description above refers to the invention, more than one invention may be described.

What is claimed is:

1. A system for regulating gas flow for a computer room containing a plurality of computer components, the system comprising:
    physically separate first and second vents configured to direct gas from a gas supply toward the computer components;
    a plurality of sensors each disposed adjacent to at least a corresponding one of the computer components and each configured to provide information regarding at least a first property associated with the at least a corresponding one of the computer components, wherein at least a first property comprises at least one of temperature, humidity, or pressure; and
    a controller coupled to the sensors and the vents and configured to use a first value, of the first property, corresponding to a first computer component associated with the first vent, to adjust a cross sectional area of a passage of the second vent to change a second gas flow rate through the second vent, the change in the second gas flow rate effecting a change in a first gas flow rate through the first vent, wherein the first value is primarily associated with the first computer component associated with the first vent and substantially unrelated to a value of the first property corresponding to a second computer component associated with the second vent,
    wherein each of the first and second computer components is associated with a target temperature value, and an extreme temperature value representative of a priority,
    wherein the first vent is associated with a first, higher-priority computer component represented by a lower associated extreme temperature value and the second vent is associated with a second, lower-priority computer component represented by a higher associated extreme temperature value,
    wherein the controller is configured to cooperatively adjust the target temperature values associated with each of the first and second computer components and the cross sectional areas of the passages of first and second vents based, at least in part, on the extreme temperature values representative of the priorities associated with each of the first and second computer components, and the temperatures associated with each of the first and second computer components,
    wherein the controller is configured to respond to a temperature associated with the first, higher-priority computer component exceeding the target temperature value associated with the first computer component by increasing the target temperature value associated with the second, lower-priority computer component to a value that does not exceed the extreme temperature value associated with the second computer component, and
    wherein the controller is configured to adjust the cross sectional area of the passage of the second vent to change a second gas flow rate through the second vent to reduce the gas flow rate through the second vent in response to the increased target temperature value associated with the second computer component being substantially equal to a measured temperature value associated with the second computer component so as to increase the first gas flow rate through the first vent associated with the higher priority first computer component to cause increased cooling to the first computer component.

2. The system of claim 1 wherein the controller is configured to effect changes in gas flow rate through both the second vent and the first vent.

3. The system of claim 1 wherein the controller is configured to monitor the temperature associated with the high-priority computer component, and to respond to the temperature associated with the high-priority computer component decreasing to the target temperature value associated with the high-priority computer component by decreasing the target temperature associated with the lower-priority computer component.

4. The system of claim 3 wherein the controller is configured to adjust the cross sectional area of a passage of the second vent to change a second gas flow rate through the second vent to increase the gas flow rate through the second vent in response to decreasing the target temperature value associated with the second computer component.

5. The system of claim 1, wherein the controller is further configured to:
    increase the target temperature value associated with the first computer component upon a first determination that at least one of the temperatures associated with the first and second computer components is greater than the sum of the target temperature and a corresponding deadband value respectively associated with the first and second computer components, a second determination that at least one of the first vent or the second vent is fully open, and a third determination that the target temperature value associated with the first computer component is less than the extreme temperature value associated with the first computer component; and
    increase the second target temperature value upon the first determination that at least one of the temperatures associated with the first and second computer components is greater than the sum of the target temperature and a corresponding deadband value respectively associated with the first and second computer components, the second determination that at least one of the first vent or the second vent is fully open, and a fourth determination that the target temperature value associated with the second computer component is less than the extreme temperature value associated with the second computer component.

6. A system for regulating gas flow for a computer room containing a plurality of computer components, the system comprising:
- physically separate first and second vents configured to direct gas from a gas supply, shared by the first and second vents, toward respective computer components, the first and second vents having first and second passages, respectively, each being configured to vary a degree of openness of the first and second passages, respectively, wherein each of the computer components is associated with a target temperature value, and a high temperature limit representative of a priority, and wherein the first vent is associated with a higher-priority computer component represented by a lower high temperature limit and the second vent is associated with a lower-priority computer component represented by a higher associated high temperature limit;
- a plurality of sensors each disposed in close proximity to at least a corresponding one of the computer components and configured to provide information regarding at least a temperature at the sensor; and
- a controller coupled to the sensors and the first and second vents and configured to cooperatively adjust the target temperature values associated with each of the computer components and the degree of openness of the first and second passages based, at least in part, on the high temperature limits representative of the priorities associated with each of the computer components and the temperatures associated with each of the computer components such that the controller is configured to:
  - receive first information regarding a value of a first temperature at a first sensor of the plurality of sensors,
  - use the first information to adjust the degree of openness of the passage of the first vent to change a first gas flow rate through the first vent to maintain the first temperature within a first range of temperatures, the first range of temperatures having a first high temperature limit,
  - receive second information regarding a value of a second temperature at a second sensor of the plurality of sensors,
  - use the second information to adjust the degree of openness of the passage of the second vent to change a second gas flow rate through the second vent to maintain the second temperature within a second range of temperatures, the second range of temperatures having a second high temperature limit, and
  - respond to the first temperature exceeding the first high temperature limit while the degree of openness of the first vent equals or exceeds the openness threshold by decreasing the degree of openness of the passage of the second vent when a measured temperature associated with the lower priority computer component is substantially equal to a target temperature value associated with the lower priority computer component to effect a decrease in the second gas flow rate through the second vent and to effect an increase in the first gas flow rate through the first vent to cause increased cooling to the higher priority computer component; and
  - respond to the first temperature exceeding the first high temperature limit while the degree of openness of the first vent equals or exceeds the openness threshold, and the second temperature exceeding the second high temperature limit by increasing the second high temperature limit.

7. The system of claim 6 wherein the effected increase in the first gas flow rate through the first vent changes the first temperature toward a more desirable value and the effected decrease in the second gas flow rate through the second vent changes the second temperature toward a less desirable value.

8. The system of claim 7 wherein the first vent is associated with a first computer component and the effected decrease in the second gas flow rate through the second vent is effected because the second vent is associated with a lower-priority computer component than the first computer component associated with the first vent.

9. The system of claim 7 wherein the controller effects changes in gas flow rates through a first sub-set of the vents, including a plurality of the vents but not including the first vent, to effect the change in gas flow through the first vent.

10. The system of claim 9 wherein the first sub-set of vents is associated with lower-priority computer components than the first computer component associated with the first vent.

11. The system of claim 10 wherein the controller is configured to effect changes in gas flow through a second sub-set of the vents, including a different plurality of the vents than the first sub-set, to effect values of at least one property associated with computer components associated with the second sub-set of vents to more desirable values, the second sub-set of vents being higher priority than the first sub-set of vents as the computer components associated with the second sub-set of vents are of higher priority than the computer components associated with the first sub-set of vents.

12. The system of claim 11 wherein the second sub-set of vents has at least two different priority levels, the second sub-set of vents being associated with computer components of the at least two different priority levels.

13. The system of claim 6 wherein the controller is configured to use knowledge of the first temperature relative to the at least one of a desired temperature and the first high temperature limit to effect the decrease in the second gas flow rate through the second vent.

14. The system of claim 6 wherein the system is configured such that the increase in the first gas flow rate through the first vent is effected automatically by effecting the decrease in the second gas flow rate through the second vent.

15. The system of claim 6 wherein the first information further comprises at least one of humidity, pressure, and gas flow rate.

16. The system of claim 6 wherein the decrease in the second flow rate is effected by altering the openness of louvers of the second vent.

17. The system of claim 6 wherein the controller is configured to implement at least one of a plurality of operational modes including at least one independent mode in which the gas flow rate through the second vent is changed without regard to a change in gas flow rate effected at the first vent, and at least one cooperative mode in which the gas flow rate through the second vent is changed in accordance with both the value of the first temperature and with a change in the first gas flow rate effected by the first vent.

18. The system of claim 6 wherein the first temperature is one of an extreme temperature associated with the plurality of computer components and an average temperature associated with the plurality of computer components.

19. The system of claim 6 wherein the controller comprises a plurality of controllers corresponding to and couple to respective ones of the vents.

20. The system of claim 6 wherein the controller is configured to effect the decrease in the degree of openness in the second vent to decrease the second gas flow rate through the second vent without the first vent being altered.

21. The system of claim 6 wherein the controller is further configured to respond to the first temperature no longer exceeding the first high temperature limit and the degree of openness of the first vent being below the openness threshold by decreasing the second high temperature limit.

22. An intelligent vent subsystem for use in a system of vent subsystems for regulating gas flow to computer components in a computer room containing the computer components, the intelligent vent subsystem being associated with a first of the computer components and comprising:
- a conduit coupled to a gas supply, shared by the vent subsystem and another vent subsystem in the system of vent subsystems, and providing a passage for gas flow through at least one vent associated with the vent subsystem;
- an adjustable first damper connected to the conduit and configured to affect a first gas flow rate through the conduit;
- a driver connected to the damper and configured to cause the damper to move to vary a degree of openness of the damper to affect the first gas flow rate through the conduit;
- a communication interface configured to receive first information regarding a value of a first temperature in proximity to the first of the computer components, and to receive second information regarding a value of a second temperature at the another vent subsystem, the second information further including an indication of a degree of openness of a second damper associated with the another vent subsystem, wherein each of the computer components is associated with a target temperature value, and a high temperature limit representative of a priority, and wherein the first damper is associated with a higher-priority computer component represented by a lower high temperature limit and a second damper is associated with a lower-priority computer component represented by a higher associated high temperature limit; and
- a controller connected to the driver and the communication interface and configured to cooperatively adjust the target temperature values associated with each of the computer components and the degree of openness of the first and second dampers based, at least in part, on the high temperature limits representative of the priorities associated with each of the computer components and the temperatures associated with each of the first and second computer components such that the controller is configured to:
  - use the first information to control the driver to cause the first damper to move to adjust the degree of openness of the first damper to change the first gas flow rate through the conduit to maintain the first temperature within a first range of temperatures, the first range of temperatures having a first high temperature limit,
  - respond to the second temperature exceeding the second high temperature limit while the degree of openness of the second damper equals or exceeds the openness threshold by controlling the driver to cause the first damper to move to decrease the degree of openness of the first damper when a measured temperature value associated with the first computer component is substantially equal to the target temperature value associated with the first component to effect a decrease in the first gas flow rate through the conduit and to effect an increase in a second gas flow rate through the second damper to cause increased cooling to the second computer component; and
  - respond to the second temperature exceeding the second high temperature limit while the degree of openness of the second damper equals or exceeds the openness threshold and the first temperature exceeding the first high temperature limit by increasing the first high temperature limit.

23. The subsystem of claim 22 wherein the second information received by the communication interface indicates that the second temperature exceeds the second high temperature limit.

24. The subsystem of claim 22 wherein the first information receive by the communication interface indicates a desired value of another property associated with the vent subsystem and the controller is configured to control the first damper to affect the first gas flow rate through the conduit to change a second value of the second property toward the desired value.

25. The subsystem of claim 22 wherein the controller is configured to use information regarding at least one of a humidity, a pressure differential, or a gas flow rate associated with the another vent subsystem to control the driver to affect the first gas flow rate through the conduit.

26. The subsystem of claim 22 wherein the controller is configured to use information regarding relative function priorities of the first computer component and a computer component associated with another vent subsystem to control the drive to affect the gas flow rate through the conduit.

27. The subsystem of claim 22 wherein the controller is further configured to transfer data regarding at least one property associated with the vent subsystem toward the another vent subsystem.

28. The intelligent vent subsystem of claim 22 wherein the controller is further configured to respond to the second temperature no longer exceeding the second high temperature limit and the degree of openness of the second damper being below the openness threshold by decreasing the first high temperature limit.

* * * * *